United States Patent
Jha

(12) United States Patent (10) Patent No.: US 9,882,585 B1
Jha (45) Date of Patent: Jan. 30, 2018

(54) SYSTEMS AND METHODS FOR PARTITIONED ROOT SEARCH FOR ERROR LOCATOR POLYNOMIAL FUNCTIONS IN REED-SOLOMON FORWARD ERROR CORRECTION DECODING

(71) Applicant: Cadence Design Systems, Inc., San Jose, CA (US)

(72) Inventor: Sarath Kumar Jha, Greater Noida (West) (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/179,852

(22) Filed: Jun. 10, 2016

(51) Int. Cl.
*H04L 1/00* (2006.01)
*H03M 13/00* (2006.01)
*H03M 13/15* (2006.01)

(52) U.S. Cl.
CPC ..... *H03M 13/6516* (2013.01); *H03M 13/157* (2013.01); *H03M 13/1515* (2013.01)

(58) Field of Classification Search
CPC .................................................. H04L 1/0057
USPC .................. 714/776, 782, 752, 792, 795, 25
See application file for complete search history.

(56) References Cited

U.S. PATENT DOCUMENTS

| | | | | |
|---|---|---|---|---|
| 6,408,037 B1* | 6/2002 | Gienger | ............... | H03M 13/00 375/340 |
| 2003/0090945 A1* | 5/2003 | Kwon | ................ | G06F 11/1008 365/200 |
| 2003/0192007 A1* | 10/2003 | Miller | ................ | H03M 13/151 714/782 |
| 2005/0031320 A1* | 2/2005 | Yoon | ................. | G11B 27/3027 386/201 |
| 2010/0011247 A1* | 1/2010 | Shrader | ............... | G06F 11/1048 714/25 |

* cited by examiner

*Primary Examiner* — Fritz Alphonse
(74) *Attorney, Agent, or Firm* — Scwegman Lundberg & Woessner, P.A.

(57) ABSTRACT

Aspects of the present disclosure involve a system comprising a computer-readable storage medium storing at least one program, and a method of improving a speed of decoding digital data. The method may include receiving a digital communication that includes digital data; specifying a partition of a plurality of elements of a Galois field into a plurality of sets; specifying an error locator polynomial function for a Reed-Solomon forward error correction module; specifying, for each set of the plurality of sets, a second function dependent upon the error locator polynomial function and one or more characteristics of the respective set; computing the second function for each of the plurality of sets to find roots of the error locator polynomial function; outputting the roots of the error locator polynomial function to a Reed-Solomon forward error correction decoder module; and decoding the digital data included in the received digital communication using the roots.

20 Claims, 5 Drawing Sheets

SYSTEMS AND METHODS FOR PARTITIONED ROOT SEARCH FOR ERROR LOCATOR POLYNOMIAL FUNCTIONS IN REED-SOLOMON FORWARD ERROR CORRECTION DECODING

TECHNICAL FIELD

The subject matter disclosed herein relates to systems and methods for error correction in digital communications. In particular, example embodiments relate to systems and methods for partitioned root search for error locator polynomial functions in Reed-Solomon forward error correction decoding.

BACKGROUND

IEEE 802.3 industry standards for wired Ethernet utilize Reed-Solomon (RS) forward error correction (FEC) techniques for encoding data to control errors in data transmission over unreliable or noisy communication channels. The RS FEC techniques are used in the main stage in the receive path of the FEC layer, and are based on univariate polynomials over finite fields or Galois fields. These techniques use redundancy in the encoded data to enable a data receiver to detect and correct a limited number of errors in the received data. At the data receiver, error locations in the received data are found during decoding by finding roots of an error locator polynomial function. Traditional approaches to finding these roots use an exhaustive search on all elements of the finite field used by the RS encoding. This is the most computationally intensive and time-consuming stage of the RS decoding process, and therefore is a limiting factor for the decoding speed.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Figure 1:
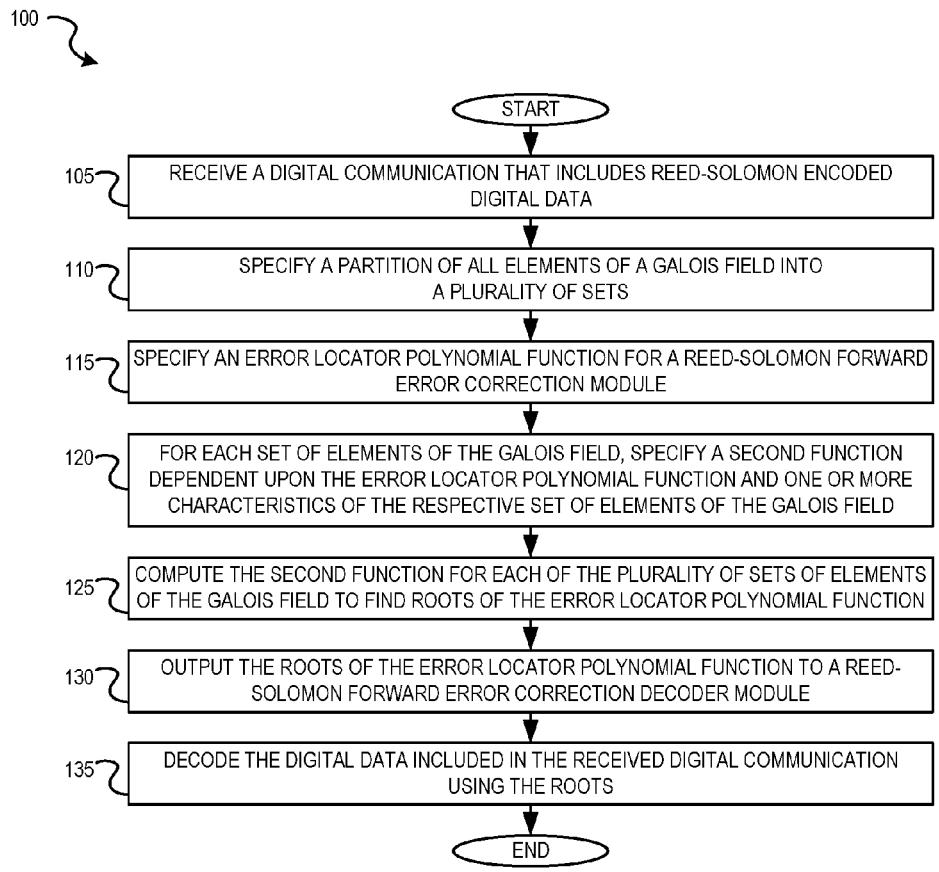
FIG. 1 is a flow chart illustrating a method for partitioned root search for error locator polynomial functions in Reed-Solomon (RS) forward error correction (FEC) decoding, according to some example embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Embodiments described herein relate to electronic design automation (EDA), and to systems, methods, devices, and instructions for generation of circuit design files. Some embodiments pertain to enhanced techniques for searching for error locator polynomial functions in Reed-Solomon (RS) forward error correction (FEC) decoding. By partitioning the root search for error locator polynomial functions in RS FEC decoding, these enhanced techniques significantly reduce the computational complexity and processing time consumed by performing RS FEC decoding at a data receiver when compared to traditional techniques.

The following description and the drawings illustrate specific embodiments to enable those skilled in the art to practice them. Other embodiments can incorporate structural, logical, electrical, process, and other changes. Portions and features of some embodiments can be included in, or substituted for, those of other embodiments. Elements of the embodiments described herein are intended to cover all available equivalents of the elements described.

Without limitation, the disclosed exemplary embodiments are described in the context of industry standard IEEE 802.3 wired Ethernet communications systems and methods. While the systems and methods involved in these example embodiments may find particular application in IEEE 802.3 wired Ethernet communications, this should not be construed as limiting, as the systems and methods described herein could equally well find application in other data decoding and communications systems and methods involving RS coding, e.g., cryptography. For example, although the embodiments disclosed herein are described using a Galois field of order $2^{10}$, which has 10-bit symbols, and which is generated using the polynomial equation $x^{10}+x^3+1=0$, the specific order of the finite field and the specific polynomial equation that is used to generate the finite field used in the RS coding can be different in various embodiments.

Recently, working groups developing the IEEE 802.3 standards for 25G, 50G, 100G, and 400G speeds have specified RS decoding for FEC. Because of the significantly higher speeds of these new protocols compared to prior Ethernet protocols, the computational complexity and processing time consumed by traditional approaches to find roots of an error locator polynomial function using an exhaustive search on all elements of the finite field used by the RS decoding in order to locate errors in the received data is problematic. Therefore, a new method to find these roots is desirable in order to reduce the computational complexity and increase the speed of the RS FEC decoding process.

In the traditional approaches to performing a root search of an error locator polynomial function f(x), f(x) is evaluated at all elements of the finite field in order to find the roots. For example, when the finite field is a Galois field of order $2^{10}$, i.e., $GF(2^{10})$, there are 1024 elements in the finite field. A hardware architecture to perform a Chien search using fixed multipliers is typically used to perform this task. However, this approach is infeasible for larger finite fields because of the computational complexity and processing time consumed by performing an exhaustive search on all elements of the finite field. In contrast to the prior traditional approaches, embodiments described herein find the roots of the error locator polynomial function without performing an exhaustive search on all elements of the finite field.

FIG. 1 is a flow chart illustrating a method 100 for partitioned root search for error locator polynomial functions in RS FEC decoding, according to some example embodiments. In the method 100, all elements of a Galois field $GF(2^m)$ are partitioned into K+1 disjoint sets S[k] (where $0 \leq k \leq K$) and searches for roots of an error locator polynomial function f(x) are carried out for each of the sets S[k] independently. By avoiding the exhaustive root search of the prior traditional approaches, the partitioned root search approach is at least four times faster even in the worst case. The approach can be implemented in both hardware-based and software-based RS decoding. The method 100 may be embodied in computer-readable instructions for execution by a hardware component (e.g., a processor) such that the operations of the method 100 may be performed by a specially configured machine, or the method 100 may be embodied in an application specific or custom integrated circuit. It shall be appreciated that the method 100 may be deployed on various hardware configurations.

In an operation 105, a digital communication that includes RS encoded digital data is received by a digital communication receiver. The digital communication receiver may include electronic circuits and a computing processor. In an operation 110, a partition of all elements of a Galois field (e.g., $GF(2^m)$) is specified by one or more hardware processors as being partitioned into a plurality of sets, e.g., K+1 sets S[k], where $0 \leq k \leq K$. In an operation 115, an error locator polynomial function f(x) for an RS FEC module is specified by one or more hardware processors, e.g., an electronic computing device. The error locator polynomial function f(x) may be specified as a monic polynomial of a degree d, a univariate polynomial in which the nonzero coefficient of the term of the highest degree equals 1. The number of terms of the error locator polynomial function is also specified, as well as the coefficients for each of the terms of the error locator polynomial function, such that the error locator polynomial function is a member of the Galois field $GF(2^m)$. The error locator polynomial function f(x) may be specified by using a computational algorithm, for example, the Berlekamp-Massey algorithm.

In an operation 120, for each set of the plurality of sets of elements of the Galois field, a second function dependent upon the error locator polynomial function and one or more characteristics of the respective set of elements of the Galois field is specified. In an embodiment, for each k from 0 to K, gk(x) is specified by one or more hardware processors as $x\hat{}((2^m-1)/(K+1))+b^k$ and Gk(x) is specified by one or more hardware processors as gcd(f(x), gk(x)), where $\log(b)=(2^m-1)/(K+1)$. In an operation 125, the second function is computed for each of the plurality of sets of elements of the Galois field to find roots of the error locator polynomial function. In an embodiment, for each k from 0 to K, Gk(x) is computed by one or more hardware processors to search for, find, and save roots of f(x) in each of the K+1 sets S[k] separately. In various embodiments, k may be looped around operations 120 and 125 such that Gk(x) is both defined and computed for each k, and all roots of S[k] are found and saved, before k is incremented. In other embodiments, k may be looped in different operations independently.

In an operation 130, the roots of the error locator polynomial function are output to a RS FEC decoder module by one or more hardware processors. In an operation 135, the digital data included in the received digital communication is decoded using the roots of the error locator polynomial function by one or more hardware processors, e.g., the RS FEC decoder module.

Figure 2:
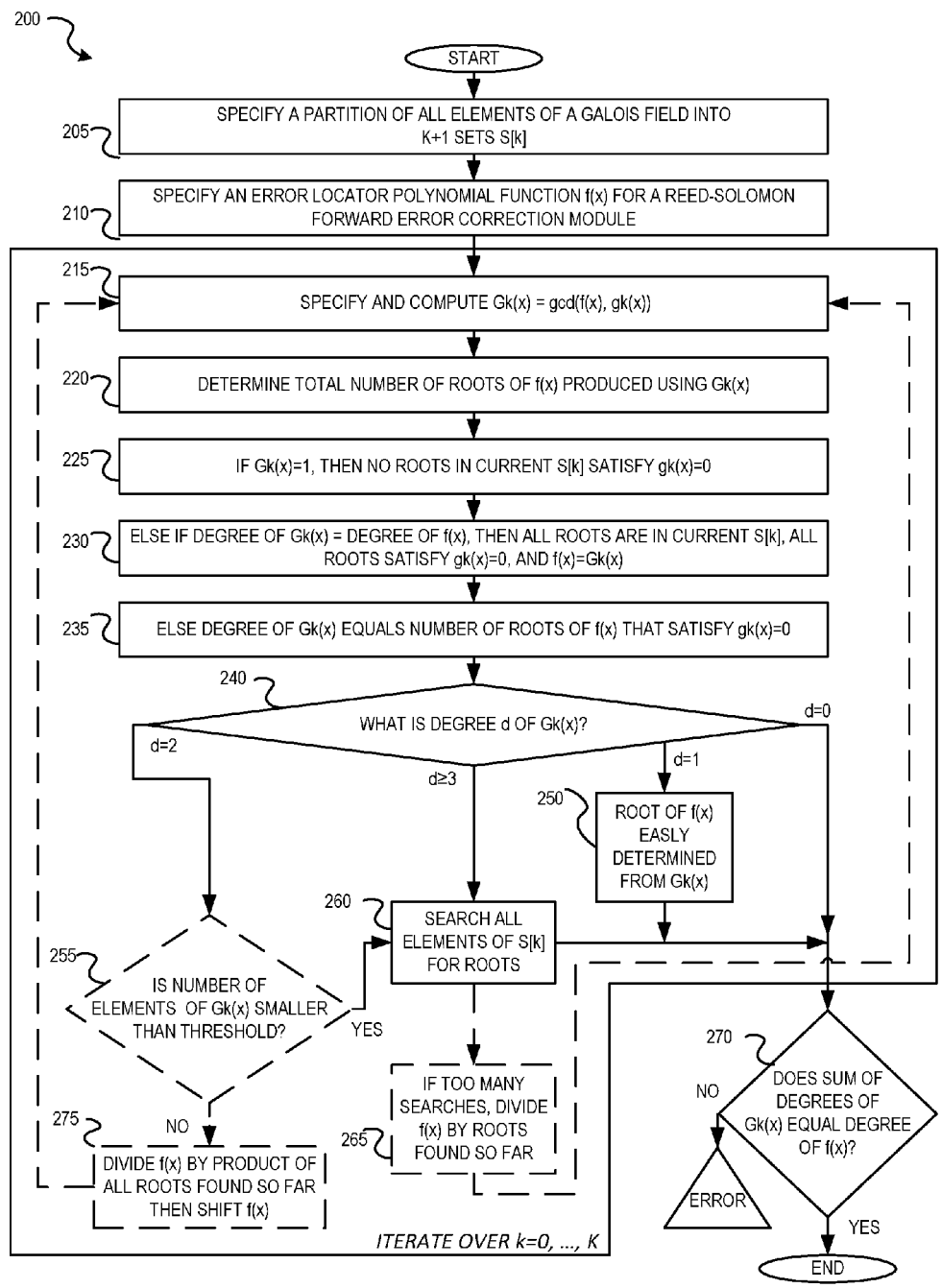
FIG. 2 is a flow chart illustrating another method for partitioned root search for error locator polynomials in RS FEC decoding, according to some example embodiments.

FIG. 2 is a flow chart illustrating a method 200 for partitioned root search for error locator polynomial functions in RS FEC decoding, according to some example embodiments. The method 200 may be an embodiment of the method 100.

The method 200 is based on the following equations and assertions. First, a finite field is defined as:

$$GF(2^{10}) = \{0, \alpha^0, \alpha^1, \ldots, \alpha^{1023}\} \quad \text{Eq. (1)}$$

where $GF(2^{10})$ is a Galois field, and $\alpha$ is a primitive root of the following equation:

$$x^{10} + x^3 + 1 = 0. \quad \text{Eq. (2)}$$

$GF(2^{10})$ is partitioned into 31 sets S[k], for k=0, ..., 30, each S[k] having 33 possible roots as elements. Each set S[k] contains all elements in the finite field which satisfy the following equation:

$$gk(x) = x^{33} + \alpha^{33 \cdot k} = x^{33} + b^k = 0. \quad \text{Eq. (3)}$$

An error locator polynomial function f(x) is defined as a polynomial having a degree less than 16 in the finite field $GF(2^{10})$ generated using Equation 2 above. The roots of error locator polynomial function f(x) in each S[k] are given by:

$$Gk(x) = gcd(f(x), gk(x)). \quad \text{Eq. (4)}$$

Also:

$$x^{31} + 1 = (x+1)(x+b) \ldots (x+b^{30}) \quad \text{Eq. (5)}$$

where b is a primitive $31^{st}$ root of unity in $GF(2^{10})$, i.e., $b^{31}=1$. Because $31 \cdot \log(b) = 1023$, and $\log(b) = \alpha^{33}$, the 31 roots of unity in $GF(2^{10})$ are $\alpha^{33 \cdot k}$ for k=0, ..., 30. Now, replacing x in Equation (5) with $y^{33}$ yields:

$$y^{1023} + 1 = (y^{33}+1)(y^{33}+b) \ldots (y^{33}+b^{30}) \quad \text{Eq. (6)}$$

where y is a member of $GF(2^{10})$ and $$y^{1023} + 1 = y(y+10)(y+(2) \ldots (y+1022), \quad \text{Eq. (7)}$$

so $y^{1023}+1$ contains all the elements of $GF(2^{10})$. Thus, the roots of error locator polynomial function f(x) are given by:

$$gcd(f(x), y^{1023}+1), \quad \text{Eq. (8)}$$

which contains all the roots of f(x) in the finite field $GF(2^{10})$, and:

$$f(x) = \text{Product}(gcd(f(x), (y^{33}+b^k))) \quad \text{Eq. (9)}$$

for k=0, ..., 30 contains all the roots of f(x) in the finite field $GF(2^{10})$. In fact, computing gcd(f(x), $y^{33}+b^k$) for k=0, ..., 30 is enough to get all roots of f(x) in $GF(2^{10})$. The polynomial $y^{33}+b^k$ has 33 roots, and there is no overlap since $33 \times 31 = 1023$. Thus, S[k]={roots of $y^{33}+b^k$} for k=0, ..., 30 is a partition of elements of $GF(2^{10})$.

In an operation 205, all elements of a Galois field $GF(2^m)$ are partitioned into K+1 sets S[k], where $0 \leq k \leq K$. In a nonlimiting example embodiment, m=10 and the Galois field $GF(2^{10})$ is the set of all possible roots of Equation 2 shown above. Without limitation, the method 200 is also applicable to other finite fields, for example $GF(2^m)$ where $2^m-1$ has a suitable prime factorization for use as a finite field in RS codes.

In an operation 210, an error locator polynomial function f(x) for an RS FEC module is specified by an electronic computing device as a monic polynomial, a univariate polynomial in which the nonzero coefficient of the term of the highest degree equals 1. In an embodiment, the degree of the polynomial is specified to be less than 16. The number of terms of the error locator polynomial function is also specified, as well as the coefficients for each of the terms of the error locator polynomial function, such that the error locator polynomial function is a member of the Galois field $GF(2^m)$. The error locator polynomial function $f(x)$ may be specified by using a computational algorithm, for example, the Berlekamp-Massey algorithm. While the examples presented herein refer to $GF(2^{10})$, this should not be construed as limiting.

In RS codes RS(528,514) and RS(544,514), as used in the RS FEC layer of the IEEE 802.3 25G, 50G, 100G, and 400G draft specifications, the symbols are 10 bits long and are members of the Galois field $GF(2^{10})$ having an irreducible polynomial $x^{10}+x^3+1$. The maximum degree of the error locator polynomial function for RS(528,514) is 7, and for RS(544,514) it is 15. In $GF(2^{10})$, $x^{1023}+1=(x^{33}+1)(x^{33}+b)(x^{33}+b^2) \ldots (x^{33}+b^{30})$ where $\log(b)=1023/31=33$ in the finite field $GF(2^{10})$. Each S[k] denotes the n roots of $x^n+b^k=0$, so S[k] together partitions the elements of the finite field into K+1 disjoint sets with n elements each, where $n=(2^m-1)/(K+1)$. More specifically for this example, K=30 and S[k] denotes the 33 roots of $x^{33}+b^k=0$ for k=0, ..., 30, so that S[k] together partitions the elements of the finite field into 31 disjoint sets with 33 elements each.

In an operation 215, gk(x) is defined as $(x^{33}+b^k)$, and Gk(x) is specified as gcd(f(x), gk(x)), where gcd is the greatest common divisor of the error locator polynomial function f(x) and $gk(x)=(x^{33}+b^k)$. Beginning in operation 215 and continuing until operation 270, the variable k is looped from 0 to K. At each value of k, Gk(x) is computed for each unique error locator polynomial function f(x) that is specified in operation 210 to determine the roots of the error locator polynomial function f(x). This can be efficiently performed because $x^{33}$ mod f(x) can be efficiently computed using the technique of repeated squaring. For example, $(x^{2^i})$ mod f(x)=$(x^1$ mod f(x))$^2$, and each stage can be rounded off to f(x). Once $x^{33}$ mod f(x) is determined, $(x^{33}+b^k)$ mod f(x) can be easily obtained by adding $b^k$ to $x^{33}$ mod f(x). Then 31 gcd operations of f(x) and a polynomial of degree less than the degree of f(x) are performed. These 31 gcd operations can also be efficiently performed.

In an operation 220, the total number of roots of f(x) produced using Gk(x) is determined. This determines the roots of f(x) that are present in the set S[k]. For example, in operation 225, if Gk(x)=1, then there are no roots in the current set S[k] that satisfy gk(x)=0. The method then proceeds to operation 240. Alternatively, if the degree of Gk(x) is the same as the degree of f(x), then in operation 230 it is determined that all roots of f(x) are roots of Gk(x) and S[k] is the only partition of interest with all the roots. The method then proceeds to operation 240. Otherwise, in operation 235, the degree of Gk(x) is determined to equal the number of roots of f(x) that satisfy gk(x)=0, i.e., the roots in the set S[k]. In this case, some, but not all, roots of f(x) will satisfy gk(x)=0, and the number of such roots equals the degree of Gk(x) and determines the number of roots in S[k]. Following operation 235, the method proceeds to operation 240.

In operation 240, the degree d of Gk(x) is evaluated to determine what operations should be performed next. If the degree d of Gk(x) is 0, then the method 200 proceeds to the next iteration over k (i.e., the next set S[k]) and returns to operation 215 unless all sets S[k] have been searched, in which case the method proceeds to operation 270. If the degree d of Gk(x) is determined to be 1, then in operation 250 the root of f(x) is easily determined from Gk(x), and the method 200 returns to operation 215 while iterating over the values of variable k until the performance of the operations have been completed for k=K, after which the method proceeds to operation 270. If the degree d of Gk(x) is determined to be equal to or greater than a threshold of 3, then in operation 260 all elements of S[k](e.g., 33 elements) are searched to determine the roots until all the roots are found. Following operation 260, the method 200 returns to operation 215 while iterating over the values of variable k until the performance of the operations have been completed for k=K, after which the method proceeds to operation 270, discussed below. In an optional feature of operation 260, if the number of searches becomes too large as determined by a threshold set according to computational efficiency and other criteria as understood by one of ordinary skill in the art, then in an optional operation 265 the error locator polynomial function f(x) can be divided by the product of all roots found before the point in operation 260 that the number of searches is considered to have become too large, and the method 200 can then be repeated starting at operation 215. The number of searches would not normally be considered too large in embodiments where the error locator polynomial function f(x) has a degree less than 16.

Alternatively, if the degree d of Gk(x) is determined to be equal to 2 in operation 240, then in an optional operation 255 it is determined if the number of elements of Gk(x) is smaller than a threshold determined according to computational and other criteria as understood by one of ordinary skill in the art. If the degree d of Gk(x) is determined to be equal to 2 and the number of elements of Gk(x) is smaller than the threshold, then the method proceeds to operation 260 in which all elements of S[k] (e.g., 33 elements) are checked to determine the roots. Alternatively, if the degree d of Gk(x) is determined to be equal to 2 and the number of elements of Gk(x) is not smaller than the threshold (e.g., greater than the threshold), then in optional operation 275 the error locator polynomial function f(x) is divided by the product of all the roots found so far in the method, and the error locator polynomial function is then shifted by a random shift amount a, where a is an element of the finite field $GF(2^{10})$; i.e., f(x) becomes f(x+a). The method then proceeds to operation 215 using the newly shifted error locator polynomial function f(x+a). In some embodiments, if no roots have been found so far in the current iteration between operation 215 and operation 275, then at least one S[k] can be searched for a root in operation 275 so that at least some roots are found during each iteration. In embodiments in which the optional operations 255 and 275 are not included, operation 260 is performed when the degree d of Gk(x) equals 2, also.

The threshold of degree 3 for beginning operation 260 is based on the maximum degree of the error locator polynomial function f(x) being less than 16. In embodiments where larger degrees for the error locator polynomial function are used, the threshold may be adjusted upward in order to reduce the number of searches. Normally, for error locator polynomial functions f(x) with degrees less than 16, operation 260 is not performed many times, because there would be very few S[k] with more than three roots, and only a few with two roots. Even if a set S[k] has more than 3 roots, many roots would be found in just 33 searches. Operation 260 is performed at most 2 to 3 times during the iterations of the method 200 for embodiments in which the maximum degree of the error locator polynomial function f(x) is less than 16.

In operation 270, it is determined whether the sum of degrees of Gk(x) for k=0, ..., K is equal to the degree of f(x). If they are not equal, it is determined that there has been an uncorrectable error for the RS codeword. Otherwise, the method 200 is complete, because all roots have been found by this point in the method 200. In an alternative embodiment of the method 200, to check for the error condition earlier in the method 200, operation 270 may be performed directly after performing operation 215 for all k=0 . . . K. In this alternative embodiment, the operations 220 to 270 can be performed for all k=0 . . . K.

The random shift of operation 275 alters the distribution of roots of f(x) into S[k] so that there are some greatest common divisors (gcd(f(x+a),gk(x))) of degree 1, which give roots directly, and some roots are aggregated so that they can be searched in S[k] to obtain the roots of f(x+a). The roots that are determined for f(x+a) are the same as the roots for the original f(x) shifted by a.

In general, the method 200 partitions the finite field $GF(2^m)=Union(S[k])$ for k=0, . . . , K, where each S[k] is the set of elements of the finite field satisfying the polynomial equation $x^n+b^k=0$, where $b=\alpha^n$ is a primitive $(K+1)^{st}$ root of unity in $GF(2^m)$ and $n=(2^m-1)/(K+1)$. In an example, m=10, K=30, and each S[k] has n=33 elements which can be pre-computed from the log table for $GF(2^{10})$. By pre-computing the elements of S[k] from the log table for $GF(2^{10})$, computational complexity and latency during the RS FEC process is reduced compared to prior methods. Using the method 200, only a few S[k] are searched for finding the roots of the error locator polynomial function f(x) of degree less than 16 in the finite field $GF(2^{10})$. Specifically, only those S[k] which correspond to the inequality $gcd(f(x),x^{33}+b^k)\neq 1$ are searched, as illustrated in FIG. 2. The distribution of roots of f(x+a) into S[k] are different after a random shift in operation 275. Thus, the distribution of roots into S[k] can be changed easily with a random shift in operation 275.

The approach of the method 200 can be further enhanced when Gk(x) is quadratic, i.e., there are two roots in S[k]. In this enhanced method, a pre-computed table of values for a set T(s) is used to avoid some number of searches on S[k] in determining roots of the error locator polynomial function f(x). Specifically, the table T(s) is defined as the set of values m1, m2 such that $\alpha^{(K+1)\cdot m1}+\alpha^{(K+1)\cdot m2}=s$, for m1 and m2 between 0 and $n=(2^m-1)/(K+1)$, inclusive. For example, when m=10 and K=30, $\alpha^{31\cdot m1}+\alpha^{31\cdot m2}=s$, for m1 and m2 between 0 and 33, inclusive. If variables a and b are both members of $GF(2^{10})$ and S[k], and $Gk(x)=x^2+ax+b$ is quadratic, i.e., there are two roots $r_1$ and $r_2$ in S[k] which can be written as $r_1=\alpha^{31\cdot m1+k}$ and $r_2=\alpha^{31\cdot m2+k}$, for k=0, . . . , 30, and m1=0, . . . , 33, and m2=0, . . . , 33, then $31\cdot(m1+m2)=\log(b)\cdot 2k$ (+1023 can optionally be added to use the other of two solutions), and $\alpha^{31\cdot m1}+\alpha^{31\cdot m2}=a\cdot\alpha^{-k}$. Possible values of m1 and m2 can be obtained from T(s) and the product can be checked against b to find the final values of m and m2.

For example, $x^2+ax+b=(x+r_1)(x+r_2)$ yields $r_1\times r_2=b$ and $r_1+r_2=a$, which yields $\alpha^{31\cdot(m1+m2)}\cdot\alpha^{2\cdot k}=b$ and $\alpha^k(\alpha^{31\cdot m1}+\alpha^{31\cdot m2})=a$. Then, the two equations $31\cdot(m1+m2)=\log(b)-2\cdot k$ (+1023 if needed), and $\alpha^{31\cdot m1}+\alpha^{31\cdot m2}=a\cdot\alpha^{-k}$, can be solved using T(s) to determine m1 and m2. This approach would avoid 33 searches on S[k] when Gk(x) is quadratic.

The approach of the method 200 can also be further enhanced to perform the search for roots after the gcd computation in operation 215 in $n=(2^m-1)/(K+1)$ (e.g., 33 when m=10 and K=30) equivalent searches. Thus, the total searches performed would be the search for gcd+33 in the worst case. This can be accomplished because if a partition S[k] has n roots, then n multiplications for each of the 33 elements of S[k] would be performed. Thus, 33 searches would involve 33×n multiplications. If a degree 15 polynomial was factored into 3 roots each in 5 partitions S[k], the total multiplications performed would be 33×3×5, which is equivalent to 33×3×5/15=33 searches. Thus, the root search stage of the method 200 would be fixed at 33 equivalent searches.

The greatest common divisor computation of Gk(x) can also be performed efficiently, although this is the most computationally complex operation of the method 200. Consider Gk(x) computed as $Gk(x)=gcd(f(x), x^{33}+b^k)=gcd(f(x), x^{33}+\alpha^{33k})$ for k=0, . . . , 30. First, the computation of $u(x)=x^{33}$ mod f(x) is performed using repeated squaring. Then, $x^{33}+b^k$ mod $f(x)=x^{33}$ mod $f(x)+b^k$, and $Gk(x)=gcd(f(x), u(x)+\alpha^{33k})$ for k=0, . . . , 30. Since the degree of u(x) is less than the degree of f(x), each gcd can be computed in a maximum of d(d+1)/2 multiplications, which is (d+1)/2 searches. Thus, 31 gcd computations would be equivalent to 31×(d+1)/2 searches in total. For a degree d of f(x), the gcd stage of the method 200 is equivalent to about 31×d/2 searches in total, and the search stage for roots of f(x) in the partitions S[k] is equivalent to a total of 33 searches. Thus, the total searches of the method 200 for m=10 and f(x) of degree d is (31×d/2)+33.

The following table shows the worst-case data for the number of searches of the gcd stage and the search stage of the method 200.

TABLE 1

Worst-case number of searches for the method 200.

| Degree of Input | gcd Stage (Equivalent Searches) | Search Stage | Total Searches |
|---|---|---|---|
| 2 | 31 | 0 | 31 |
| 3 | 46 | 33 | 79 |
| 4 | 62 | 33 | 95 |
| 5 | 82 | 33 | 115 |
| 6 | 93 | 33 | 126 |
| 7 | 114 | 33 | 147 |
| 8 | 130 | 33 | 163 |
| 9 | 165 | 33 | 198 |
| 15 | 248 | 33 | 281 |

In contrast to the worst-case data for the method 200 shown in Table 1, the exhaustive search of the prior art has 1024 searches for any degree greater than 1.

The approach of the method 200 avoids the time-consuming exhaustive search of prior methods by partitioning the set of all elements into smaller partitions. The search for roots in the partitions is very efficient, because either roots are obtained from gcd(f(x), gk(x)) of degree 1, or a search is performed on S[k] for which gcd(f(x), gk(x)) has degree of 3 or greater. A desired partition into S[k] can be determined by using a random shift of the input error locator polynomial function f(x). Since the degree of the error locator polynomial function f(x) is less than 16, there will be fewer S[k] that need to be searched exhaustively. In the worst case, when the degree of the error locator polynomial function f(x) is 15, the exhaustive search of operation 260 is only performed on 3 or 4 sets of 33 elements each for $GF(2^{10})$. Furthermore, the number of searches will be even fewer for smaller-degree error locator polynomial functions than for error locator polynomial functions with a degree of 15. For example, for a quadratic or cubic polynomial f(x), there will be a maximum of 33 searches. The random shift of operation 275 improves the worst-case performance of the method 200.

There are significant cost savings in deploying electronic circuits and systems to implement the approach of the method 200. Hardware dedicated to performing the method 200 also considerably improves the speed of the root search process compared to prior systems. Furthermore, the method 200 can be performed in other situations where a fast root search is desired outside the context of the problem addressed by the present application.

Figure 3:
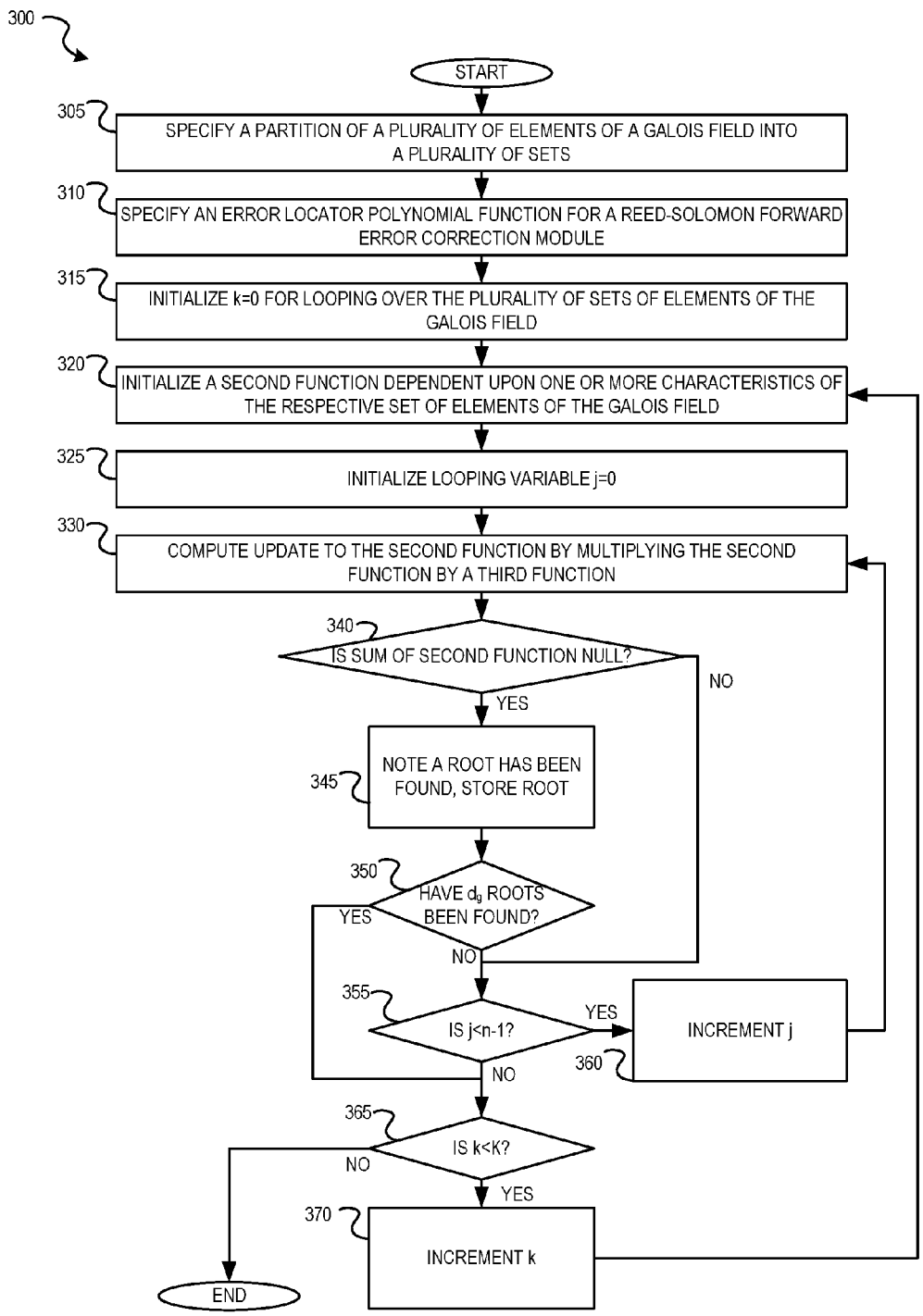
FIG. 3 is a flow chart illustrating a method for partitioned root search for error locator polynomial functions in Reed-Solomon forward error correction decoding for implementation using hardware similar to that used by the Chien search method, according to some example embodiments.

FIG. 3 is a flow chart illustrating a method 300 for partitioned root search for error locator polynomial functions in RS FEC decoding for implementation using hardware similar to that used by the Chien search method, according to some example embodiments. The method 300 may be an embodiment of the method 100. Searching for and finding roots of the error locator polynomial function $f(x)$ in a partition $S[k]$ can be done efficiently using an approach similar to the existing Chien search. The method 300 may be performed in an electronic data receiver including a computing processor and an instruction memory storing executable instructions executable by the computing processor to decode a received data transmission having Reed-Solomon encoded digital data.

In an operation 305, a partition of a plurality of elements of a Galois field is specified to partition the plurality of elements into a plurality of sets. For example, all elements of a Galois field $GF(2^m)$ may be partitioned by one or more hardware processors into K+1 sets $S[k]$, $0 \le k \le K$. Each $S[k]$ is the set of elements of the finite field satisfying the polynomial equation $x^n + b^k = 0$, where $b = \alpha^n$ is a primitive $(K+1)^{st}$ root of unity in $GF(2^m)$ and $n = (2^m - 1)/(K+1)$. In a nonlimiting example embodiment, $m=10$, $K=30$, Galois field $GF(2^{10})$ is the set of all possible roots of Equation 2 shown above, and each of the K+1=31 partitions $S[k]$ has n=33 elements which can be pre-computed from the log table for $GF(2^{10})$. In this embodiment, all the elements of the finite field $GF(2^{10})$ for each partition $S[k]$ are of the form $\alpha^{(31 \cdot i + k)}$ for $i = 0, \ldots, 32$. Without limitation, the method 300 is also applicable to other finite fields, for example $GF(2^m)$ where $2^m - 1$ has a suitable prime factorization for use as a finite field in RS codes.

In an operation 310, an error locator polynomial function for an RS FEC module is specified by one or more hardware processors. For example, an error locator polynomial function $f(x)$ of degree d may be specified by an electronic computing device as a monic polynomial, a univariate polynomial in which the nonzero coefficient of the term of the highest degree equals 1. In an embodiment, the degree d of the polynomial is specified to be less than 16. The number of terms of the error locator polynomial function is also specified, as well as the coefficients for each of the terms of the error locator polynomial function, such that the error locator polynomial function is a member of the Galois field $GF(2^m)$. While the examples presented herein refer to $GF(2^{10})$, this should not be construed as limiting.

In an operation 315, k is initialized at 0 for looping over the plurality of sets of elements of the Galois field. In the approach of method 300 to finding the roots of $f(x)$, the equation $gk(x) = c[i] \cdot x^i$ where $i = 0, \ldots, d_g$, and $d_g$ is the degree of $gk(x)$, is considered for $k = 0, \ldots, K$. Thus, $gk(x) = c[0] + c[1] \cdot x + c[2] \cdot x^2 + \ldots + c[d_g] \cdot x^{d_g}$. In an operation 320, by one or more hardware processors, for each set of the plurality of sets, a second function dependent upon one or more characteristics of the respective set of elements of the Galois field is initialized. For example, $Gk[i]$ is initialized as $Gk[i] = \alpha^{k \cdot i}$ for all $i = 0, \ldots, d_g$, and $d_g$ is initialized as the degree of $gk(x)$. $Gk[i]$ is a single term of $gk(x)$, and there are $(d_g+1)$ terms of the type $Gk[i]$. Thus, $Gk[0] = c[0]$, $Gk[1] = c[1] \cdot \alpha^k, \ldots, Gk[d_g] = c[d_g] \cdot \alpha^{k \cdot d_g}$. In embodiments where K=30 and n=33, $d_g$ can be at most equal to 33.

In an operation 325, looping variable j is initialized to 0. In an operation 330, an update to the second function is computed by multiplying the second function by a third function. For example, the second function $Gk[i]$ is updated by multiplying the second function $Gk[i]$ by a third function $\alpha^{(K+1) \cdot i}$, i.e., $Gk[i] = Gk[i] \cdot \alpha^{(K+1) \cdot i}$ for all $i = 0, \ldots, d_g$. In embodiments in which K=30, $Gk[i]$ is updated as $Gk[i] = Gk[i] \cdot \alpha^{31 \cdot i}$. The approach of the method 300 uses fixed multipliers of $\alpha^{31 \cdot i}$ for $i = 0, \ldots, 32$ when K=30 and n=33.

In an operation 340, it is determined whether a sum of the second function is null. For example, one or more hardware processors may determine whether the sum of $Gk[i]$ over all $i = 0, \ldots, d_g$ equals 0 during each iteration of j. If the result of operation 340 is yes, then in an operation 345 it is noted that a root has been found, and the root is stored in memory. Following operation 345, it is determined whether $d_g$ roots have already been found in the current partition $S[k]$ in an operation 350. If the result of operation 345 is yes, then all the roots of $gk(x)$ for the current partition $S[k]$ have been found, and the method 300 advances to an operation 365 to begin searching for roots in the next partition $S[k]$. Otherwise, if the result of operation 345 is no ($d_g$ roots have not already been found in the current partition $S[k]$), then the method 300 continues to an operation 355. If the result of operation 340 is no, then the process 300 continues from that point to operation 355.

In operation 355, it is determined whether j is less than n-1. If the result of operation 355 is yes, then the method 300 advances to operation 360. In operation 360, j is incremented, and the method 300 then returns to operation 330. Otherwise, if the result of operation 355 is no (e.g., j=n-1), then the method 300 advances to operation 365. In operation 365, it is determined whether k is less than K. If the result of operation 365 is yes, then in an operation 370, k is incremented and the method 300 returns to operation 320. Otherwise, if the result of operation 365 is no (e.g., k=K), all sets $S[k]$ have been searched for roots, so the method 300 ends. At the end of the method 300, the roots of the error locator polynomial function may be output to an RS FEC decoder module for use in decoding RS encoded data present in a received digital data transmission.

Figure 4:
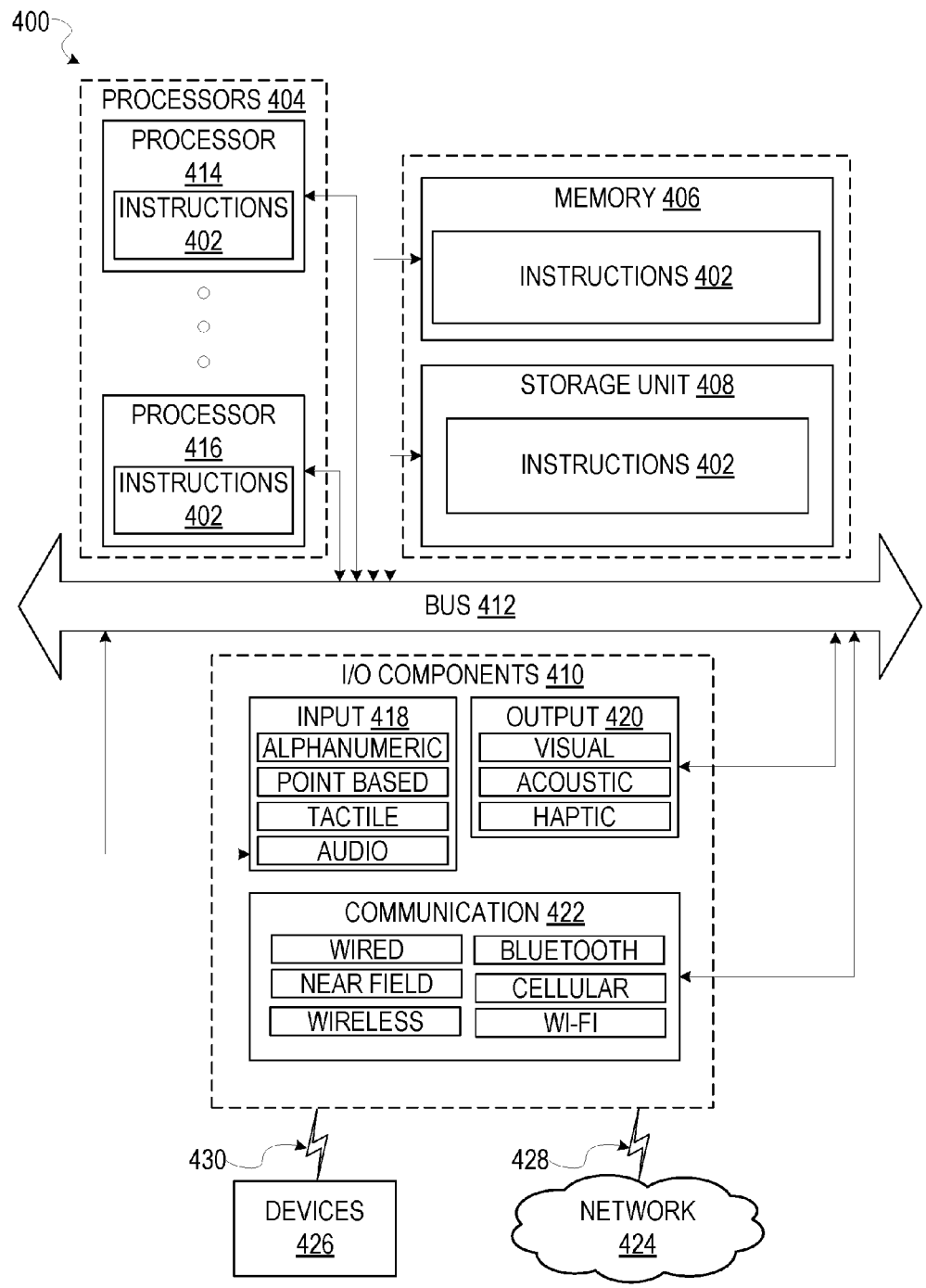
FIG. 4 is a diagrammatic representation of a machine in the example form of a computer system within which a set of instructions for causing the machine to perform any one or more of the methodologies discussed herein may be executed.

FIG. 4 is a block diagram illustrating components of a machine 400, according to some example embodiments, able to read instructions from a machine-readable medium (e.g., a machine-readable storage medium) and perform any one or more of the methodologies discussed herein. Specifically, FIG. 4 shows a diagrammatic representation of the machine 400 in the example form of a system, within which instructions 402 (e.g., software, a program, an application, an applet, an app, a driver, or other executable code) for causing the machine 400 to perform any one or more of the methodologies discussed herein may be executed. For example, the instructions 402 include executable code that causes the machine 400 to execute the method 100, method 200, and/or method 300. In this way, these instructions 402 transform the general, non-programmed machine 400 into a particular machine programmed to carry out the described and illustrated methods 100, 200, and/or 300 in the manner described herein. The machine 400 may operate as a standalone device or may be coupled (e.g., networked) to other machines.

By way of non-limiting example, the machine 400 may comprise or correspond to a television, a computer (e.g., a server computer, a client computer, a personal computer (PC), a tablet computer, a laptop computer, or a netbook), a set-top box (STB), a personal digital assistant (PDA), an entertainment media system (e.g., an audio/video receiver), a cellular telephone, a smart phone, a mobile device, a wearable device (e.g., a smart watch), a portable media player, or any machine capable of executing the instructions 402, sequentially or otherwise, that specify actions to be taken by the machine 400. Further, while only a single machine 400 is illustrated, the term "machine" shall also be taken to include a collection of machines 400 that individually or jointly execute the instructions 402 to perform any one or more of the methodologies discussed herein.

The machine 400 may include processors 404, memory 406, a storage unit 408, and I/O components 410, which may be configured to communicate with each other such as via a bus 412. In an example embodiment, the processors 404 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 414 and a processor 416 that may execute the instructions 402. The term "processor" is intended to include multi-core processors 404 that may comprise two or more independent processors (sometimes referred to as "cores") that may execute instructions contemporaneously. Although FIG. 4 shows multiple processors, the machine 400 may include a single processor with a single core, a single processor with multiple cores (e.g., a multi-core processor), multiple processors with a single core, multiple processors with multiple cores, or any combination thereof.

The memory 406 (e.g., a main memory or other memory storage) and the storage unit 408 are both accessible to the processors 404 such as via the bus 412. The memory 406 and the storage unit 408 store the instructions 402 embodying any one or more of the methodologies or functions described herein. The instructions 402 may also reside, completely or partially, within the memory 406, within the storage unit 408, within at least one of the processors 404 (e.g., within the processor's cache memory), or any suitable combination thereof, during execution thereof by the machine 400. Accordingly, the memory 406, the storage unit 408, and the memory of the processors 404 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 402. The term "machine-readable medium" shall also be taken to include any medium, or combination of multiple media, that is capable of storing instructions (e.g., instructions 402) for execution by a machine (e.g., machine 400), such that the instructions, when executed by one or more processors of the machine (e.g., processors 404), cause the machine to perform any one or more of the methodologies described herein (e.g., method 100, method 200, and method 300). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 410 may include a wide variety of components to receive input, provide output, produce output, transmit information, exchange information, capture measurements, and so on. The specific I/O components 410 that are included in a particular machine 400 will depend on the type of the machine 400. For example, portable machines such as mobile phones will likely include a touch input device or other such input mechanisms, while a headless server machine will likely not include such a touch input device. It will be appreciated that the I/O components 410 may include many other components that are not specifically shown in FIG. 4. The I/O components 410 are grouped according to functionality merely for simplifying the following discussion and the grouping is in no way limiting. In various example embodiments, the I/O components 410 may include input components 418 and output components 420. The input components 418 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 420 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 410 may include communication components 422 operable to couple the machine 400 to a network 424 or devices 426 via a coupling 428 and a coupling 430 respectively. For example, the communication components 422 may include a network interface component or another suitable device to interface with the network 424. In further examples, the communication components 422 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 426 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network 424 (e.g., the Internet) and via one or more appropriate interfaces (e.g., APIs).

Electronic Apparatus and System

Example embodiments may be implemented in digital electronic circuitry, in computer hardware, firmware, or software, or in combinations of them. Example embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 5:
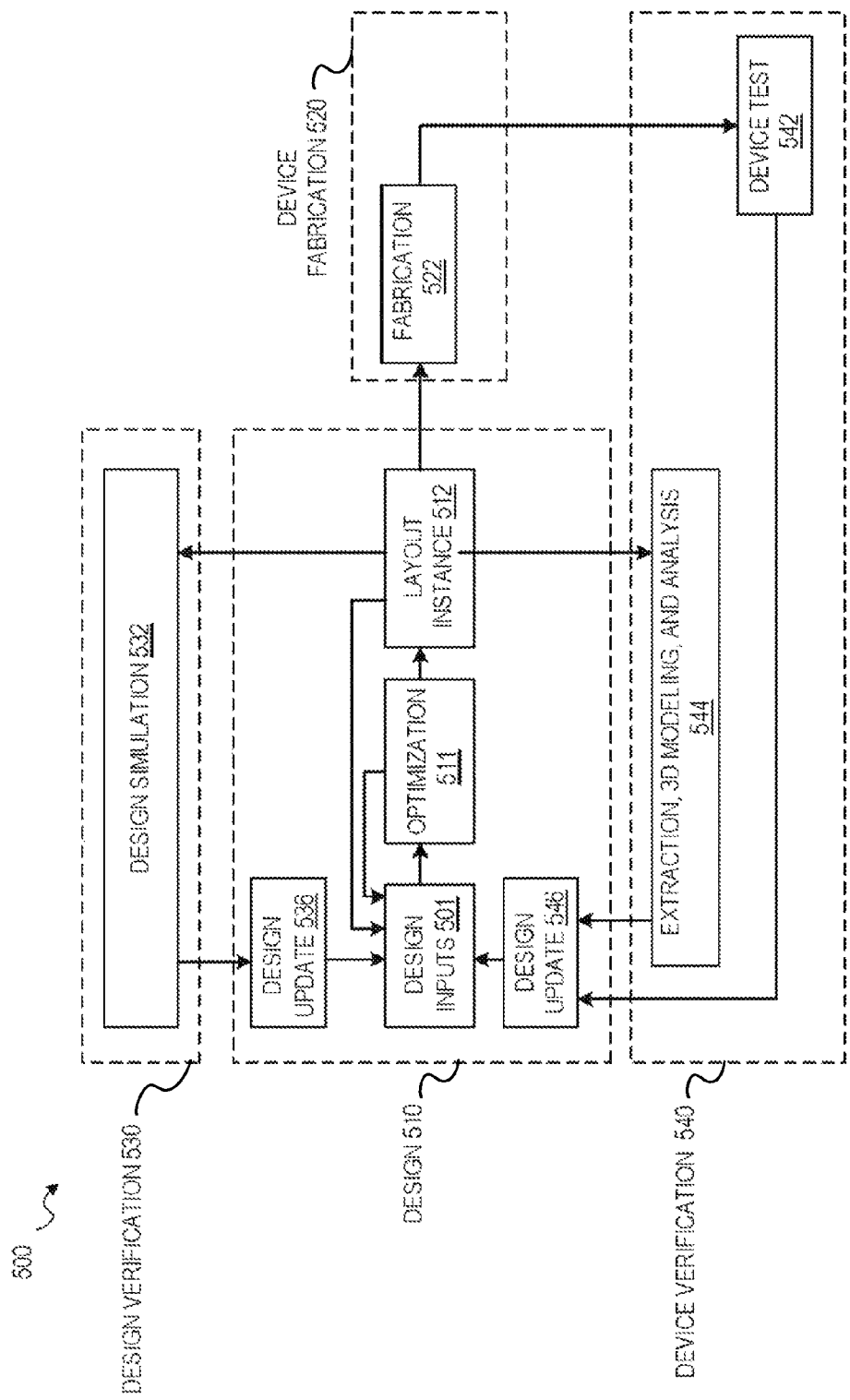
FIG. 5 is a diagram illustrating one possible design process flow for generating a circuit, including embodiments to implement partitioned root search for error locator polynomial functions in RS FEC decoding, and in various embodiments, to integrate with a larger integrated circuit comprising different design blocks.

FIG. 5 is a diagram illustrating one possible design process flow for generating a circuit, including embodiments to implement a partitioned root search for error locator polynomial functions in RS FEC decoding, and in various embodiments, to integrate with a larger integrated circuit comprising different design blocks. As illustrated, the overall design flow 500 includes a design phase 510, a device fabrication phase 520, a design verification phase 530, and a device verification phase 540. The design phase 510 involves an initial design input operation 501 where the basic elements and functionality of a device are determined, as well as revisions based on various analyses and optimization of a circuit design. This design input operation 501 is where instances of an EDA circuit design file are used in the design and any additional circuitry is selected. The initial strategy, tactics, and context for the device to be created are also generated in the design input operation 501, depending on the particular design algorithm to be used.

In some embodiments, following an initial selection of design values in the design input operation 501, timing analysis and optimization according to various embodiments occurs in an optimization operation 511, along with any other automated design processes. One such process may be the automated design of a partitioned root search for error locator polynomial functions in RS FEC decoding. As described below, design constraints for blocks of a circuit design generated with design inputs in the design input operation 501 may be analyzed using hierarchical timing analysis, according to various embodiments. While the design flow 500 shows such optimization occurring prior to a layout instance 512, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 522.

After design inputs are used in the design input operation 501 to generate a circuit layout, and any optimization operations 511 are performed, a layout is generated in the layout instance 512. The layout describes the physical layout dimensions of the device that match the design inputs. This layout may then be used in the device fabrication operation 522 to generate a device, or additional testing and design updates may be performed using designer inputs or automated updates based on design simulation 532 operations or extraction, 3D modeling and analysis 544 operations. Once the device is generated, the device can be tested as part of device test 542 operations, and layout modifications generated based on actual device performance.

As described in more detail below, design updates 536 from the design simulation 532, design updates 546 from the device test 542 or the 3D modeling and analysis 544 operations, or the design input operation 501 may occur after an initial layout instance 512 is generated. In various embodiments, whenever design inputs are used to update or change an aspect of a circuit design, a timing analysis and optimization operation 511 may be performed.

For example, in various embodiments, a user may provide an input to an EDA computing device indicating placement of elements of a circuit within a first portion of a circuit design, including description of circuitry for a partitioned root search for error locator polynomial functions in RS FEC decoding. An output to a display of the EDA computing device may show details of a circuit design, and may further be used to generate results of the timing analysis, or may show recommended optimizations or automatically performed adjustments to the circuit design based on the timing analysis. Further inputs to the EDA computing device may involve adjustments as user design inputs, with additional timing analysis and optimization initiated via user operation of the EDA computing device. In some embodiments, an EDA computing device may be used to generate circuit design files describing circuitry corresponding to embodiments described herein. Such circuit design files may be used as outputs to generate photolithographic masks or other control files and components used to generate circuits that operate in accordance with various embodiments described herein.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

All publications, patents, and patent documents referred to in this document are incorporated by reference herein in their entirety, as though individually incorporated by reference. In the event of inconsistent usages between this document and those documents so incorporated by reference, the usage in the incorporated references should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A method of improving a speed of decoding digital data, the method comprising:
   receiving a wired Ethernet communication that includes digital data, the digital data being Reed-Solomon encoded;
   specifying, by one or more hardware processors, a partition of a plurality of elements of a Galois field into a plurality of sets;
   specifying, by one or more hardware processors, an error locator polynomial function for a Reed-Solomon forward error correction module;
   specifying, by one or more hardware processors, for each set of the plurality of sets, a second function dependent upon the error locator polynomial function and one or more characteristics of the respective set;
   computing, by one or more hardware processors, the second function for each of the plurality of sets to find roots of the error locator polynomial function;
   outputting, by one or more hardware processors, the roots of the error locator polynomial function to a Reed-Solomon forward error correction decoder module of a wired Ethernet communications system; and
   decoding, the Reed-Solomon forward error correction decoder module of the wired Ethernet communications system, the digital data included in the received wired Ethernet communication using the roots.

2. The method of claim 1, wherein the second function is specified as $Gk(x)=\gcd(f(x), x^n+b^k)$, where $f(x)$ represents the error locator polynomial function, k is an index representing a specific set of the plurality of sets, $0 \leq k \leq K$, each set includes $n=(2^m-1)/(K+1)$ roots of $x^n+b^k=0$, the Galois field is of order $2^m$, and $\log(b)=(2^m-1)/(K+1)$.

3. The method of claim 2, wherein m=10, K=30, and n=33.

4. The method of claim 1, further comprising, after computing the second function for each set of the plurality of sets:
   if a degree of the second function equals 1, accepting the second function as a root of the error locator polynomial function;
   if the degree of the second function equals 2 and a number of elements of the second function is less than a first threshold, searching all elements of the respective set for roots of the error locator polynomial function;
   if the degree of the second function equals 2 and the number of elements of the second function is not less than the first threshold, dividing the error locator polynomial function by a product of all roots of the error locator polynomial function found so far, then shifting the error locator polynomial function and restarting the method at specifying the second function for each of the plurality of sets; and
   if the degree of the second function equals or is greater than 3, searching all the elements of the respective set for roots of the error locator polynomial function.

5. The method of claim 4, further comprising:
   when the degree of the second function equals or is greater than 3 and a number of searches of all the elements of the respective set for roots of the error locator polynomial function exceeds a second threshold, dividing the error locator polynomial function by the product of all roots of the error locator polynomial function found so far, then returning to the method at specifying the second function for each of the plurality of sets.

6. The method of claim 4, further comprising flagging an error condition when a sum of degrees of the second function does not equal a degree of the error locator polynomial function.

7. The method of claim 4, further comprising:
   when the second function is quadratic:
   computing two roots in the respective set using a pre-computed table of values comprising a set of two values such that a sum of a third value raised to a power of the first value and the third value raised to a power of the second value equals an index into the pre-computed table, where the first value and the second value are non-negative integers having a maximum value equal to the number of members of each set of the elements of the Galois field.

8. The method of claim 4, further comprising:
   when the second function is quadratic:
   defining a table of values comprising a set of two values such that a sum of a third value raised to a power of the first value and the third value raised to a power of the second value equals an index into the pre-computed table, where the first value and the second value are non-negative integers having a maximum value equal to the number of members of each set of the elements of the Galois field; and
   solving for roots in the respective set of the elements of the Galois field using a function of the first value and the index of the respective set of the elements of the Galois field to compute the first root, and using a function of the second value and the index of the respective set of the elements of the Galois field to compute the second root.

9. The method of claim 4, further comprising computing the second function using repeated squaring.

10. A system for improving a speed of decoding digital data in a digital communication received by an electronic data receiver, the system comprising:
   a receiver that receives wired Ethernet communications that include Reed-Solomon encoded digital data;
   at least one processor of a machine; and
   a non-transitory machine-readable storage medium embodying instructions that, when executed by the at least one processor of the machine, cause the machine to perform operations comprising:
   specifying a partition of a plurality of elements of a Galois field into a plurality of sets;
   specifying an error locator polynomial function for a Reed-Solomon forward error correction module;
   specifying for each set of the plurality of sets, a second function dependent upon the error locator polynomial function and one or more characteristics of the respective set;
   computing the second function for each of the plurality of sets to find roots of the error locator polynomial function;
   outputting the roots of the error locator polynomial function to a Reed-Solomon forward error correction decoder module of a wired Ethernet communications system; and
   decoding, by the Reed-Solomon forward error correction decoder module of the wired Ethernet communications system, the digital data included in the received wired Ethernet communication using the roots.

11. The system of claim 10, wherein the second function is specified as $Gk(x)=\gcd(f(x), x+b^k)$, where $f(x)$ represents the error locator polynomial function, k is an index representing a specific set of the plurality of sets, $0 \le k \le K$, each set includes $n=(2^m-1)/(K+1)$ roots of $x+b^k=0$, the Galois field is of order $2^m$, and $\log(b)=(2^m-1)/(K+1)$.

12. The system of claim 11, wherein m=10, K=30, and n=33.

13. The system of claim 10, wherein the operations performed by the machine further comprise, after computing the second function for each set of the plurality of sets:
if a degree of the second function equals 1, accepting the second function as a root of the error locator polynomial function;
if the degree of the second function equals 2 and a number of elements of the second function is less than a first threshold, searching all elements of the respective set for roots of the error locator polynomial function;
if the degree of the second function equals 2 and the number of elements of the second function is greater than the first threshold, dividing the error locator polynomial function by a product of all roots of the error locator polynomial function found so far, then shifting the error locator polynomial function and restarting the method at specifying the second function for each of the plurality of sets; and
if the degree of the second function equals or is greater than 3, searching all the elements of the respective set for roots of the error locator polynomial function.

14. The system of claim 13, wherein the operations performed by the machine further comprise:
when the degree of the second function equals or is greater than 3 and a number of searches of all the elements of the respective set for roots of the error locator polynomial function exceeds a second threshold, dividing the error locator polynomial function by the product of all roots of the error locator polynomial function found so far, then returning to the method at specifying the second function for each of the plurality of sets.

15. The system of claim 13, wherein the operations performed by the machine further comprise flagging an error condition when a sum of degrees of the second function does not equal a degree of the error locator polynomial function.

16. The system of claim 13, wherein the operations performed by the machine further comprise:
when the second function is quadratic:
computing two roots in the respective set using a pre-computed table of values comprising a set of two values such that a sum of a third value raised to a power of the first value and the third value raised to a power of the second value equals an index into the pre-computed table, where the first value and the second value are non-negative integers having a maximum value equal to the number of members of each set of the elements of the Galois field.

17. The system of claim 13, wherein the operations performed by the machine further comprise:
when $Gk(x)$ is quadratic:
when the second function is quadratic:
defining a table of values comprising a set of two values such that a sum of a third value raised to a power of the first value and the third value raised to a power of the second value equals an index into the pre-computed table, where the first value and the second value are non-negative integers having a maximum value equal to the number of members of each set of the elements of the Galois field; and
solving for roots in the respective set of the elements of the Galois field using a function of the first value and the index of the respective set of the elements of the Galois field to compute the first root, and using a function of the second value and the index of the respective set of the elements of the Galois field to compute the second root.

18. The system of claim 13, wherein the operations performed by the machine further comprise computing the second function using repeated squaring.

19. A method of improving a speed of decoding Reed-Solomon encoded digital data, the method comprising:
specifying, by one or more hardware processors, a partition of a plurality of elements of a Galois field into a plurality of sets;
specifying, by one or more hardware processors, an error locator polynomial function for a Reed-Solomon forward error correction module;
initializing, by one or more hardware processors, for each set of the plurality of sets, a second function dependent upon one or more characteristics of the respective set;
computing, by one or more hardware processors, for each set of the plurality of sets, an update to the second function by multiplying the second function by a third function;
determining, by one or more hardware processors, that a root has been found when a sum of the second function is null;
outputting, by one or more hardware processors, the roots of the error locator polynomial function to a Reed-Solomon forward error correction decoder module of a wired Ethernet communications system; and
decoding, by the Reed-Solomon forward error correction decoder module of the wired Ethernet communications system, the digital data included in received wired Ethernet communication using the roots.

20. The method of claim 19, wherein the second function is initialized as $Gk[i]=\alpha^{k \cdot i}$, the third function is $\alpha^{(k+1) \cdot i}$, where k is an index representing a specific set of the plurality of sets, $0 \le k \le K$, each set includes $n=(2^m-1)/(K+1)$ roots of $x^n+b^k \times 0$, the Galois field is of order $2^m$, $b=\alpha^n$, $\log(b)=(2^m-1)/(K+1)$, and i ranges from 0 to a degree of a fourth function $gk(x)=c[i] \cdot x^i$.

* * * * *